US011482661B2

(12) United States Patent
Kajino et al.

(10) Patent No.: US 11,482,661 B2
(45) Date of Patent: Oct. 25, 2022

(54) PIEZOELECTRIC DRIVING DEVICE, DRIVING METHOD OF PIEZOELECTRIC DRIVING DEVICE, ROBOT, ELECTRONIC COMPONENT TRANSPORT APPARATUS, PRINTER, AND PROJECTOR

(71) Applicant: Seiko Epson Corporation, Tokyo (JP)

(72) Inventors: Kiichi Kajino, Matsumoto (JP); Yutaka Arakawa, Hara-mura (JP)

(73) Assignee: SEIKO EPSON CORPORATION

( * ) Notice: Subject to any disclaimer, the term of this patent is extended or adjusted under 35 U.S.C. 154(b) by 870 days.

(21) Appl. No.: 16/047,578

(22) Filed: Jul. 27, 2018

(65) Prior Publication Data

US 2019/0036001 A1    Jan. 31, 2019

(30) Foreign Application Priority Data

Jul. 28, 2017 (JP) .............................. JP2017-146028

(51) Int. Cl.
| | |
|---|---|
| *H01L 41/09* | (2006.01) |
| *H01L 41/04* | (2006.01) |
| *H02N 2/02* | (2006.01) |
| *H02N 2/10* | (2006.01) |
| *H01L 41/047* | (2006.01) |

(Continued)

(52) U.S. Cl.
CPC ............ *H01L 41/09* (2013.01); *B25J 9/12* (2013.01); *G03B 21/006* (2013.01); *G03B 21/2006* (2013.01); *H01L 41/042* (2013.01); *H01L 41/047* (2013.01); *H02N 2/001* (2013.01); *H02N 2/004* (2013.01); *H02N 2/006* (2013.01);

(Continued)

(58) Field of Classification Search
CPC ....... H01L 41/09; H01L 41/047; H02N 2/001; H02N 2/004; H02N 2/0055; H02N 2/006; H02N 2/026; H02N 2/103
USPC ........................................ 310/323.01–323.21
See application file for complete search history.

(56) References Cited

U.S. PATENT DOCUMENTS

| | | | | |
|---|---|---|---|---|
| 2006/0006762 A1* | 1/2006 | Matsuzaki | ............. | H02N 2/142 310/317 |
| 2007/0188048 A1* | 8/2007 | Nagahama | ............... | G04C 3/12 310/316.01 |

(Continued)

FOREIGN PATENT DOCUMENTS

| | | |
|---|---|---|
| JP | 2001-346386 A | 12/2001 |
| JP | 2016-040994 A | 3/2016 |

*Primary Examiner* — Derek J Rosenau
(74) *Attorney, Agent, or Firm* — Harness, Dickey & Pierce, P.L.C.

(57) ABSTRACT

A piezoelectric driving device includes a piezoelectric vibrating body and a driving circuit. The piezoelectric vibrating body includes a contact which extends in a first direction and comes into contact with a driven member, a first piezoelectric element which generates bending vibration in a direction intersecting with the first direction in accordance with a first driving voltage, and a second piezoelectric element which generates longitudinal vibration in the first direction in accordance with a second driving voltage. The piezoelectric vibrating body is configured such that a resonance frequency of the longitudinal vibration is higher than a resonance frequency of the bending vibration. The driving circuit sets a driving frequency of each of the first driving voltage and the second driving voltage to be equal to or higher than the resonance frequency of the longitudinal vibration.

20 Claims, 12 Drawing Sheets

(51) Int. Cl.
  *G03B 21/20* (2006.01)
  *H02N 2/00* (2006.01)
  *G03B 21/00* (2006.01)
  *B25J 9/12* (2006.01)
  *G03B 17/56* (2021.01)

(52) U.S. Cl.
  CPC ........... *H02N 2/0055* (2013.01); *H02N 2/026* (2013.01); *H02N 2/103* (2013.01); *G03B 17/561* (2013.01)

(56) References Cited

U.S. PATENT DOCUMENTS

| | | | | |
|---|---|---|---|---|
| 2007/0188050 | A1* | 8/2007 | Hashimoto | H01L 41/0913 310/323.02 |
| 2015/0158184 | A1* | 6/2015 | Kamijo | H02N 2/004 74/490.05 |
| 2015/0318801 | A1* | 11/2015 | Kamijo | H02N 2/0075 310/323.02 |

* cited by examiner

PIEZOELECTRIC DRIVING DEVICE, DRIVING METHOD OF PIEZOELECTRIC DRIVING DEVICE, ROBOT, ELECTRONIC COMPONENT TRANSPORT APPARATUS, PRINTER, AND PROJECTOR

BACKGROUND

1. Technical Field

The present invention relates to a piezoelectric driving device and various apparatuses, such as a robot provided with the piezoelectric driving device.

2. Related Art

A piezoelectric driving device is an apparatus that uses a piezoelectric element to vibrate a vibrating body and uses the vibration to move a driven member. In the piezoelectric driving device described in JP-A-2016-040994, an elliptical motion is generated in a contact at a tip end of a piezoelectric driving device by using longitudinal vibration and bending vibration, and the driven member is moved by the elliptical motion of the contact. Further, JP-A-2016-040994 discloses that, by setting the resonance frequency of bending vibration to be higher than the resonance frequency of longitudinal vibration, and by using the frequency between the two resonance frequencies as the driving frequency of the driving voltage, the driving efficiency is improved.

However, the inventors of the application have found out the following problems in a case where the resonance frequency of bending vibration is higher than the resonance frequency of longitudinal vibration as described in JP-A-2016-040994. In other words, in a case where the piezoelectric element is driven in a frequency region in which the resonance frequency is higher than that of the bending vibration, the operation is performed in a tension driving mode (pull driving mode) in which the driving force is transmitted while reducing a force by which the contact of the piezoelectric driving device pushes the driven member, and thus, it is difficult to produce a large torque. Meanwhile, in a case where the piezoelectric element is driven in a frequency region in which the resonance frequency is between the resonance frequency of the longitudinal vibration and the resonance frequency of the bending vibration, while the contact of the piezoelectric driving device increases the force of pushing the driven member, the operation is performed in an extrusion driving mode (push driving mode) for transmitting the driving force, and thus, it is possible to produce a large torque. However, since the frequency at which the extrusion driving mode can be realized is only between the resonance frequency of the longitudinal vibration and the resonance frequency of the bending vibration, in a case where the two resonance frequencies are close to each other, the range of appropriate driving frequency becomes extremely narrow. Therefore, the driving characteristics of the piezoelectric driving device become extremely peaky (steep mountain-like characteristics), and there is a problem that excellent control is difficult.

SUMMARY

An advantage of some aspects of the invention is to solve at least a part of the problems described above, and the invention can be implemented as the following configurations.

(1) According to one aspect of the invention, a piezoelectric driving device for driving a driven member is provided. The piezoelectric driving device includes a piezoelectric vibrating body and a driving circuit for electrically driving the piezoelectric vibrating body. The piezoelectric vibrating body includes a contact which extends in a first direction with respect to the driven member and comes into contact with the driven member, a first piezoelectric element which generates bending vibration in a direction intersecting with the first direction in accordance with a first driving voltage supplied from the driving circuit, and a second piezoelectric element which generates longitudinal vibration in the first direction in accordance with a second driving voltage supplied from the driving circuit. The piezoelectric vibrating body is configured such that a resonance frequency of the longitudinal vibration is higher than a resonance frequency of the bending vibration. The driving circuit sets a driving frequency of each of the first driving voltage and the second driving voltage to be equal to or higher than the resonance frequency of the longitudinal vibration.

According to the aspect, since a piezoelectric vibration module is configured such that the resonance frequency of the longitudinal vibration is higher than the resonance frequency of the bending vibration, as the first driving voltage and the second driving voltage, by generating a voltage having the driving frequency equal to or higher than the resonance frequency of the longitudinal vibration and by driving the first piezoelectric element and the second piezoelectric element, it is possible to drive the driven member while stably generating a large torque.

(2) In the piezoelectric driving device of the aspect, the driving circuit may set the driving frequency to a frequency equal to or higher than the resonance frequency of the longitudinal vibration by sweeping down the driving frequency from a frequency higher than the resonance frequency of the longitudinal vibration.

According to the aspect with this configuration, since the driving frequency is gradually swept down so as to approach the resonance frequency of the longitudinal vibration, it is possible to drive the driven member in a more stable state.

(3) In the piezoelectric driving device of the aspect, the piezoelectric vibrating body may further include a pickup electrode for detecting vibration of the piezoelectric vibrating body and supplying a vibration detection signal to the driving circuit, the driving circuit may determine the driving frequency in accordance with the vibration detection signal, and the pickup electrode may be disposed at a position on a center axis of the piezoelectric vibrating body that extends along the first direction.

According to the aspect with this configuration, since the pickup electrode is formed at a position at which it is easy to detect the longitudinal vibration and it is difficult to detect the bending vibration, the driving frequency can easily approach a value that is close to the resonance frequency of the longitudinal vibration.

(4) In the piezoelectric driving device of the aspect, the pickup electrode may be disposed at a position that becomes a node of the bending vibration.

According to the aspect with this configuration, since the vibration detected by the pickup electrode becomes unlikely to receive influence of the bending vibration, the driving frequency can easily approach a value that is close to the resonance frequency of the longitudinal vibration.

The invention can be realized in various aspects, for example, can be realized in various aspects, such as a driving method of a piezoelectric driving device, various apparatuses equipped with a piezoelectric driving device, and the like, in addition to the piezoelectric driving device. The various apparatuses include, for example, a robot, an electronic component transport apparatus, a printer, a projector, and the like.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
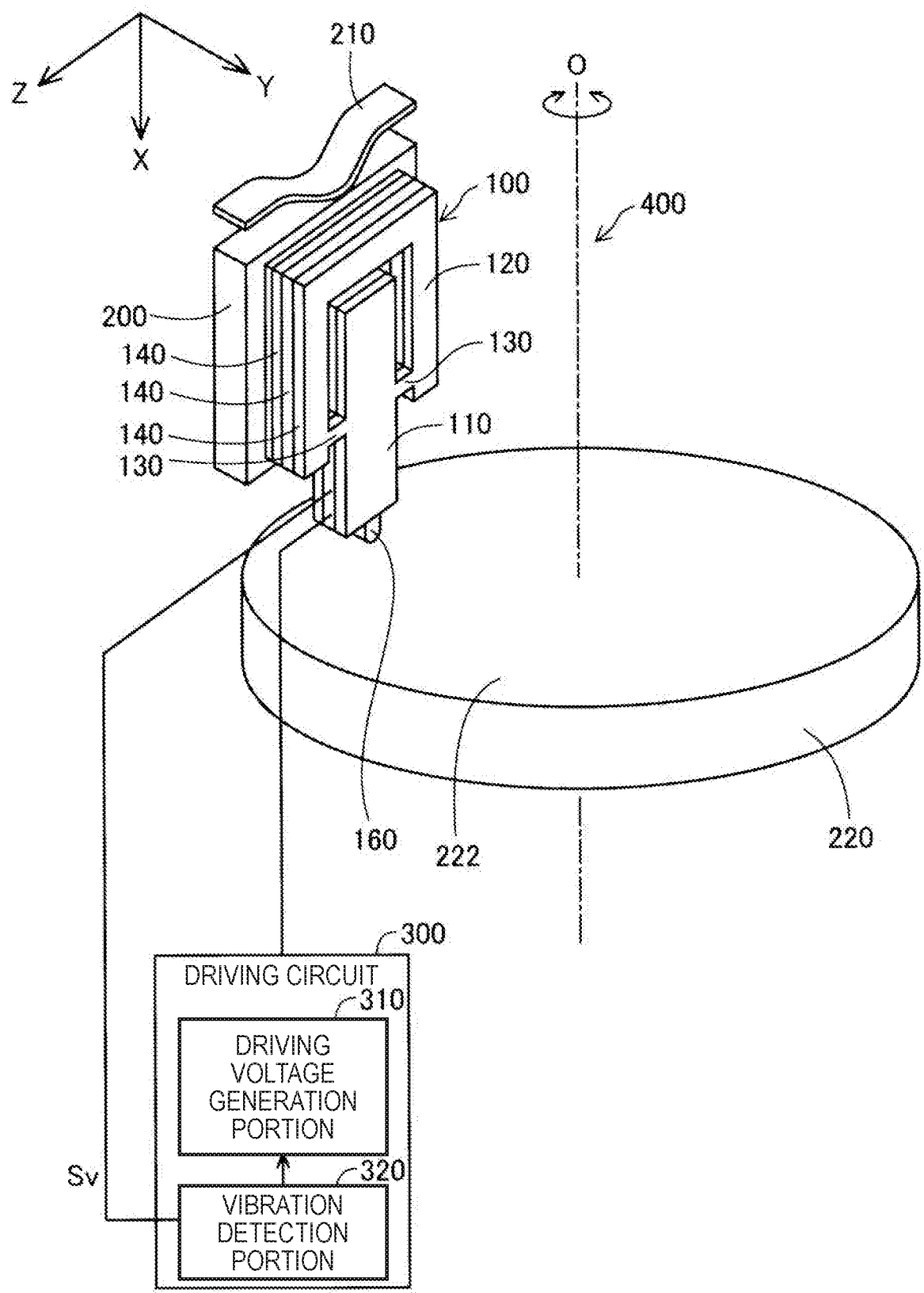
FIG. 1 is a perspective view illustrating a driving mechanism provided with a piezoelectric driving device according to a first embodiment.

FIG. 1 is a perspective view illustrating a driving mechanism provided with a piezoelectric driving device 400 according to a first embodiment. The piezoelectric driving device 400 includes a piezoelectric vibrating body 100 which drives a driven member 220 and a driving circuit 300 which electrically drives the piezoelectric vibrating body 100. In the example, the driven member 220 is a rotor which is rotatable around a rotation axis O. However, as the driven member 220, it is possible to use other types of members, such as linearly movable members. In addition, a plurality of piezoelectric vibrating bodies 100 may be provided for one driven member 220.

The piezoelectric vibrating body 100 includes a vibrating portion 110 capable of vibrating, a supporting portion 120 which supports the vibrating portion 110, and one pair of connecting portions 130 which connect the vibrating portion 110 and the supporting portion 120 to each other. The vibrating portion 110 has a shape of a substantially rectangular plate. At a tip end of the vibrating portion 110, a contact 160 which extends in an X direction from the vibrating portion 110 and comes into contact with the driven member 220 is provided. Here, the phrase "extending in the X direction from the vibrating portion 110" means being provided on the X direction side of the vibrating portion 110. The contact 160 is formed of ceramics having high wear resistance, for example, and adheres to the vibrating portion 110.

The supporting portion 120 of the piezoelectric vibrating body 100 has a U shape that surrounds a base end side (upper end side in FIG. 1) of the vibrating portion 110. Further, the supporting portion 120 is fixed to a stage 200 that serves as a supporting member. The stage 200 is pushed toward the driven member 220 side (lower side in FIG. 1) by a spring member 210. In addition, a structural member that fixes the spring member 210 is not illustrated.

The tip end of the contact 160 comes into contact with a surface 222 of the driven member 220. The piezoelectric vibrating body 100 is pressed toward the driven member 220 side by the spring member 210, and accordingly the contact 160 comes into contact with the surface 222 of the driven member 220 with a sufficient frictional force. Therefore, slipping is suppressed, and the vibration of the vibrating portion 110 can be efficiently transmitted to the driven member 220 via the contact 160.

As a configuration of the piezoelectric vibrating body 100, various configurations other than the configuration illustrated in FIG. 1 can be adopted, and for example, the supporting portion 120 and the connecting portion 130 may be omitted. In addition, in the following description, for convenience of description, the direction in which the vibrating portion 110 and the driven member 220 are arranged (that is, the longitudinal direction of the vibrating portion 110) is referred to as "first direction X", the thickness direction of the piezoelectric vibrating body 100 intersecting with the first direction X (normal direction of a vibration plane) is referred to as "second direction Y", and the width direction of the vibrating portion 110 intersecting the first direction X and the second direction Y is referred to as "third direction Z". Further, a plane defined by the first direction X and the third direction Z is referred to as "XZ plane". The XZ plane is parallel to the surface of the piezoelectric vibrating body 100. It is preferable that the three directions X, Y, and Z are orthogonal to each other.

The piezoelectric vibrating body 100 includes a plurality of piezoelectric vibration modules 140 laminated in the second direction Y. In the example of FIG. 1, the number of piezoelectric vibration modules 140 is three. The plurality of piezoelectric vibration modules 140 are joined by an electrically insulating joining member, such as an adhesive. However, the piezoelectric vibrating body 100 may be configured with one piezoelectric vibration module 140.

The plurality of piezoelectric vibration modules 140 are connected to the driving circuit 300. The driving circuit 300 includes a driving voltage generation portion 310 and a vibration detection portion 320. The driving voltage generation portion 310 has a function of supplying a driving voltage to a piezoelectric element (which will be described later) of the piezoelectric vibrating body 100. The vibration detection portion 320 is connected to a pickup electrode (which will be described later) of the piezoelectric vibrating body 100, and has a function of detecting vibration of the piezoelectric vibrating body 100. The driving voltage generation portion 310 adjusts the frequency of the driving voltage in accordance with a vibration detection signal Sv supplied from the pickup electrode to the vibration detection portion 320, and supplies the driving voltage to the piezoelectric element. An operation of the driving circuit 300 will be further described later.

Figure 2:
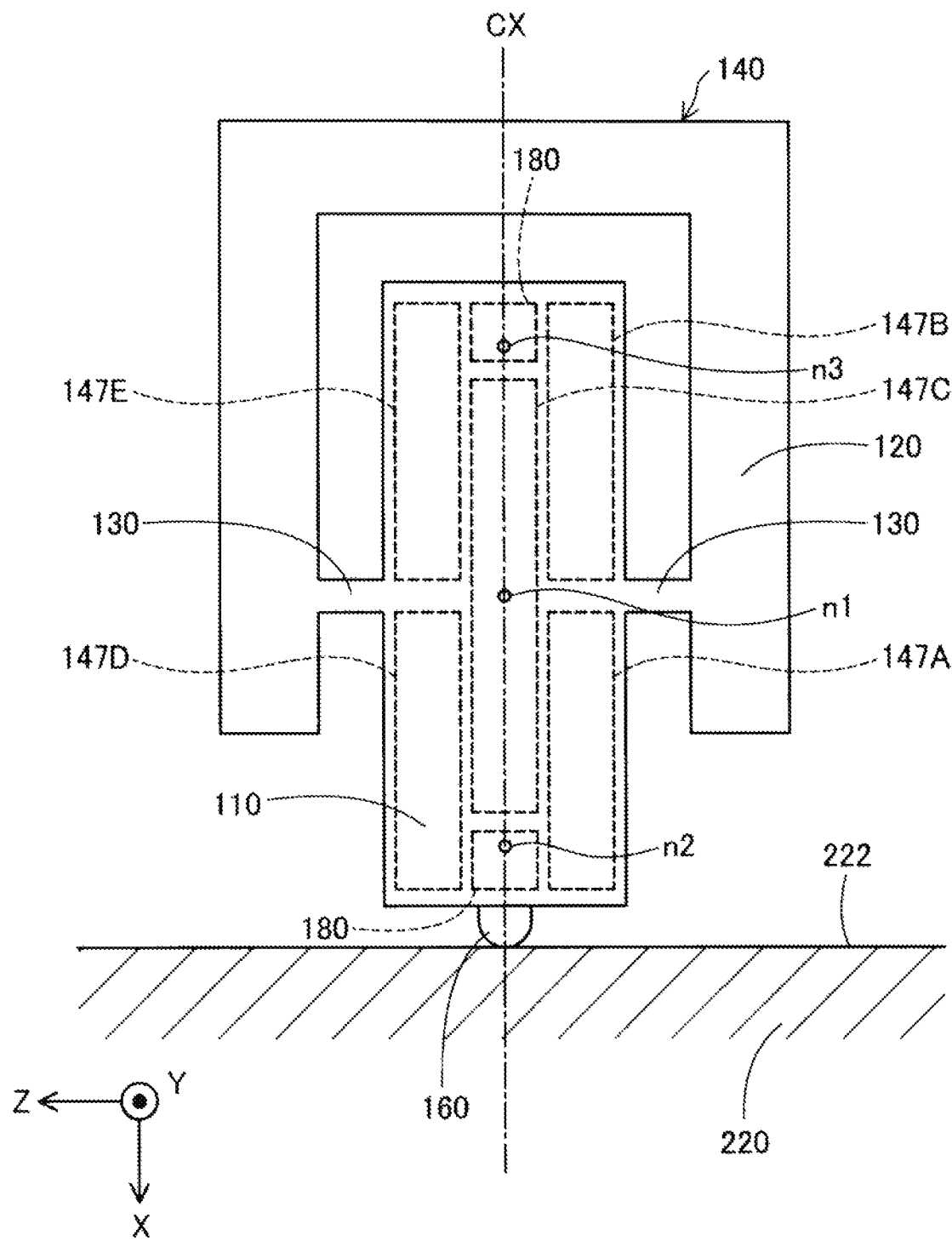
FIG. 2 is a plan view of a piezoelectric vibration module.

FIG. 2 is a plan view illustrating an example of the piezoelectric vibration module 140. The vibrating portion 110 of the piezoelectric vibration module 140 includes five piezoelectric elements 147A to 147E. One pair of piezoelectric elements 147A and 147E on one diagonal line of the rectangular vibrating portion 110 simultaneously expand and contract in the X direction to cause bending vibration in the vibrating portion 110. Another pair of piezoelectric elements 147B and 147D on another diagonal line of the vibrating portion 110 also simultaneously expand and contract in the X direction to cause bending vibration in the vibrating portion 110. However, it is preferable that the expansion and contraction of the pair of piezoelectric elements 147A and 147E and the expansion and contraction of the other pair of piezoelectric elements 147B and 147D are different in phase by 180 degrees. The piezoelectric element 147C at the center in the width direction of the vibrating portion 110 expands and contracts in the X direction and causes longitudinal vibrations along the X direction in the vibrating portion 110.

Each of the piezoelectric elements 147A to 147E has a piezoelectric body (not illustrated) and two electrodes (not illustrated) sandwiching both surfaces of the piezoelectric body. As a configuration material of the piezoelectric body, piezoelectric ceramics, such as lead titanate zirconate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, lead scandium niobate lead, or the like, can be used. The piezoelectric body configured of piezoelectric ceramics may be formed from, for example, a bulk material, or may be formed by using a sol-gel method or a sputtering method. In addition, as a configuration material of the piezoelectric body, in addition to the above-described piezoelectric ceramics, polyvinylidene fluoride, quartz, or the like may be used.

The piezoelectric vibration module 140 further includes two pickup electrodes 180. The pickup electrode 180 is an electrode for detecting the vibration of the piezoelectric vibrating body 100 and supplying a vibration detection signal Sv (FIG. 1) to the driving circuit 300. In the example of FIG. 2, the pickup electrode 180 is provided on the upper side and on the lower side of the piezoelectric element 147C at the center of the vibrating portion 110. However, only one pickup electrode 180 may be provided, and the pickup electrode 180 may be omitted.

Figure 3:
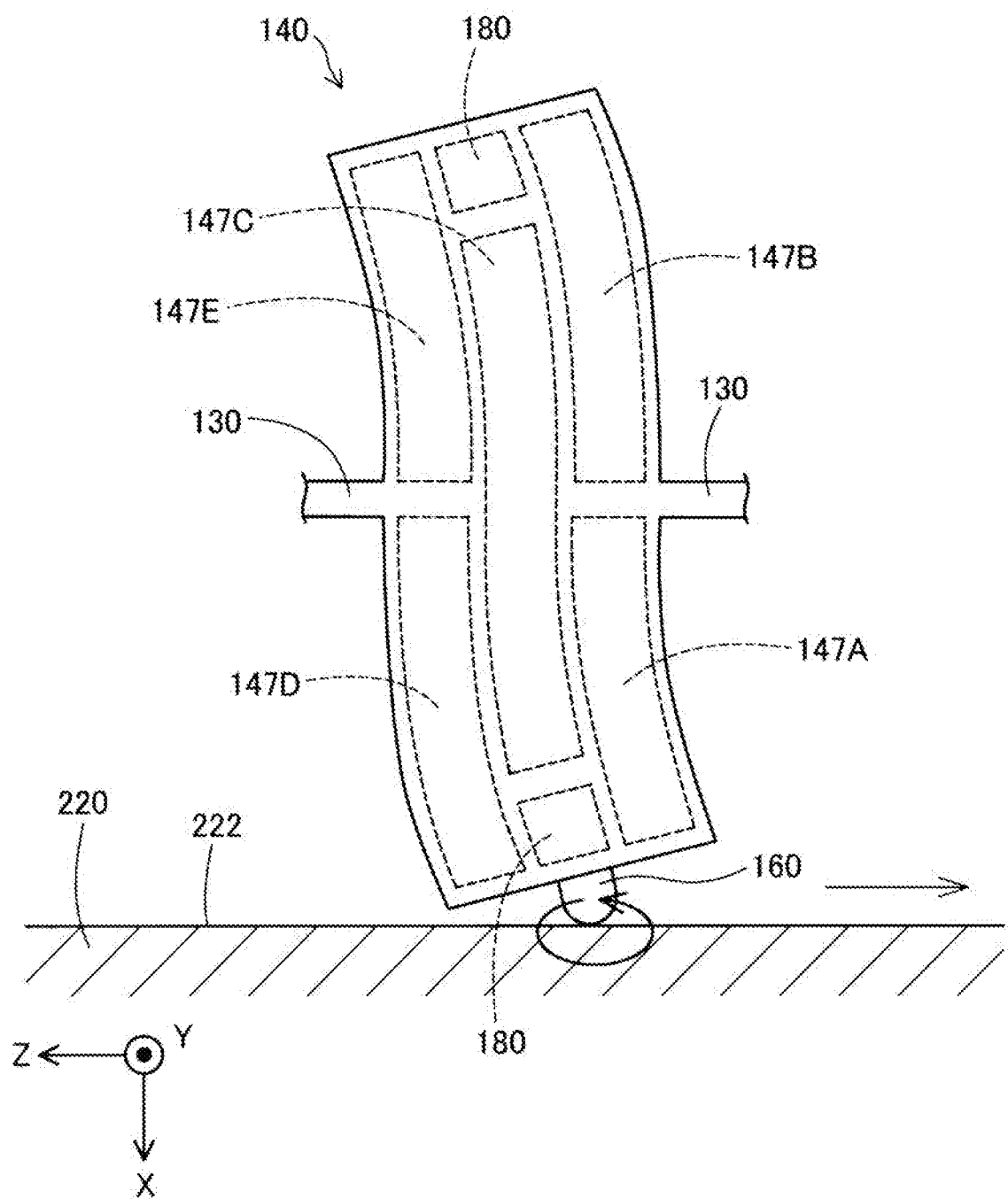
FIG. 3 is a view illustrating a state of vibration of the piezoelectric vibration module.

FIG. 3 is a schematic view illustrating a state of vibration of the piezoelectric vibration module 140. The piezoelectric vibration module 140 can vibrate such that the contact 160 elliptically moves. The elliptical motion is realized by generating the bending vibration by expansion and contraction of the pair of piezoelectric elements 147A and 147E and expansion and contraction of the other pair of piezoelectric elements 147B and 147D, and by generating the longitudinal vibration by expansion and contraction of the piezoelectric element 147C at the center. "Bending vibration" is a vibration in which the piezoelectric vibration module 140 bends in an S shape as illustrated in FIG. 3 in the plane of the piezoelectric vibration module 140. "Longitudinal vibration" is a vibration that expands and contracts along the longitudinal direction (first direction X) of the piezoelectric vibration module 140. The entire piezoelectric vibrating body 100 also vibrates similar to the piezoelectric vibration module 140. The four piezoelectric elements 147A, 147B, 147D, and 147E generate the bending vibration and correspond to "first piezoelectric element". The piezoelectric element 147C generates the longitudinal vibration and corresponds to "second piezoelectric element". The number of the first piezoelectric elements 147A, 147B, 147D, and 147E or the second piezoelectric element 147C is an example, and the number of the first piezoelectric elements and the number of the second piezoelectric elements can be appropriately set to other values. For example, the pair of first piezoelectric elements 147A and 147B may be omitted, and the bending vibration may be generated by the other pair of first piezoelectric elements 147D and 147E.

Figure 4:
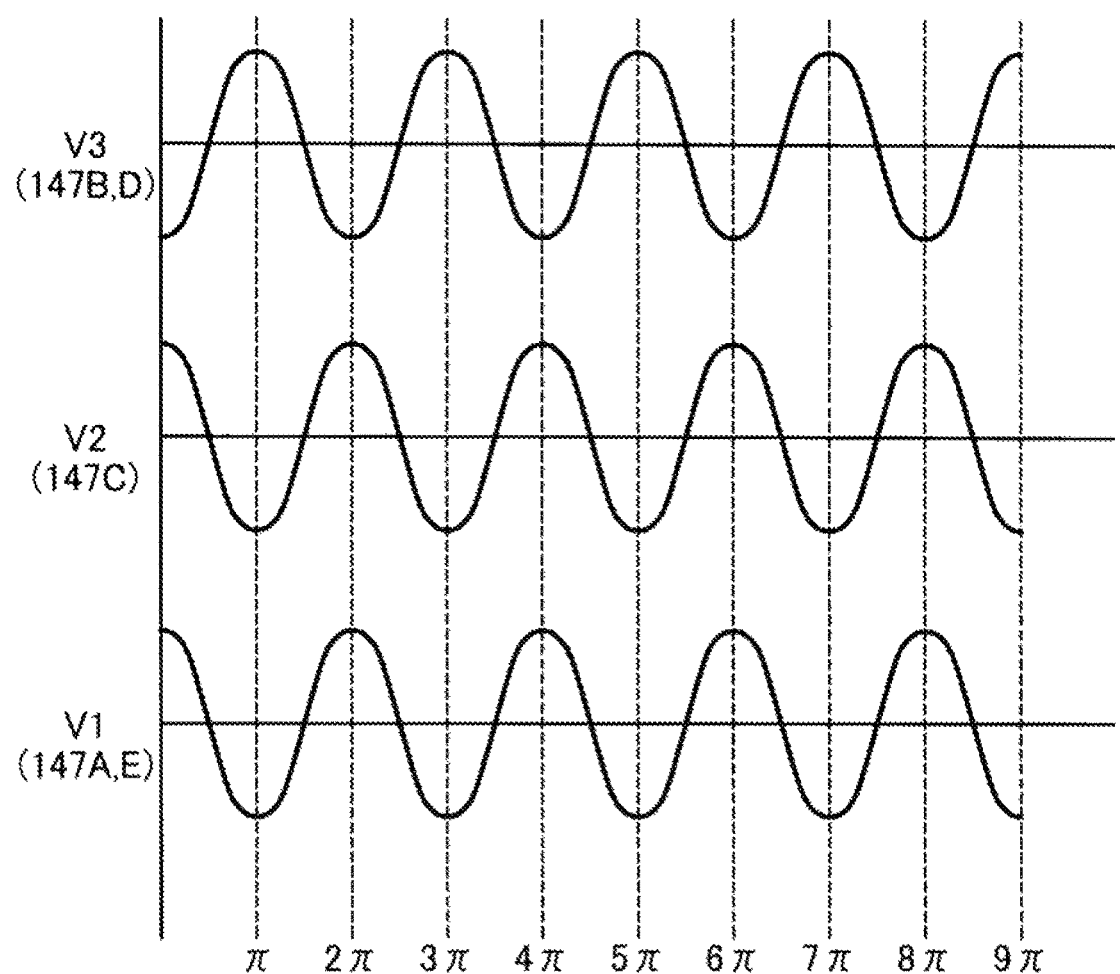
FIG. 4 is a view illustrating an example of a driving voltage waveform of the piezoelectric vibration module.

FIG. 4 illustrates an example of a waveform of the driving voltage supplied to the piezoelectric elements 147A to 147E. A driving voltage V1 is applied to the pair of piezoelectric elements 147A and 147E, a driving voltage V2 is applied to the piezoelectric element 147C, and a driving voltage V3 is applied to the other pair of piezoelectric elements 147B and 147D. In addition, the driving voltage V3 is obtained by changing the phase by $\pi$ (=180°) from the driving voltage V1, and is substantially equivalent to the driving voltage V1. The driving voltages V1 and V3 are driving voltages for generating the bending vibration in the piezoelectric vibration module 140 and correspond to "first driving voltage". The driving voltage V2 is a driving voltage for generating the longitudinal vibration in the piezoelectric vibration module 140 and corresponds to "second driving voltage". In addition, the frequencies of the first driving voltages V1 and V3 and the frequency of the second driving voltage V2 are normally set equal to each other.

The piezoelectric vibration module 140 vibrates such that the contact 160 performs elliptical motion by combining the bending vibration and the longitudinal vibration to each other (FIG. 3). In this manner, by causing the pair of piezoelectric elements 147A and 147E, the other pair of piezoelectric elements 147B and 147D, and the piezoelectric element 147C to expand and contract at different phases, the contact 160 can be vibrated along the elliptic orbit. However, when the contact 160 can be vibrated along the elliptical orbit, various waveforms other than those illustrated in FIG. 4 can be used as the waveform of the driving voltage of the piezoelectric vibration module 140. For example, the driving voltage may include a DC component in addition to an AC component. In this case, "frequency of driving voltage" means the frequency of the AC component.

As illustrated in FIG. 2, it is preferable that the pickup electrode 180 is disposed at a position on a center axis CX of the piezoelectric vibrating body 100 that extends along the first direction X in a plan view. The center axis CX is positioned to match the center axis of the vibrating portion 110 in a plan view. When placing the pickup electrode 180 at the position on the center axis CX of the piezoelectric vibrating body 100, the influence of the bending vibration decreases, and there is an advantage that it is easy to accurately detect the longitudinal vibration. It is preferable that the pickup electrode 180 is further disposed at any position of nodes n1, n2, and n3 of the bending vibration. In the example of FIG. 2, the node n1 of the bending vibration exists at the center of the vibrating portion 110 and the other two nodes n2 and n3 exist at the position in the vicinity of the end portion of the vibrating portion 110 on the center axis CX. By arranging the pickup electrode 180 at any position of the nodes n1, n2, and n3 of the bending vibration, it is possible to further reduce the influence of the bending vibration, and thus, there is an advantage that the longitudinal vibration of the piezoelectric vibrating body 100 can be more easily detected. However, the pickup electrodes 180 may be disposed at other positions.

Figure 5:
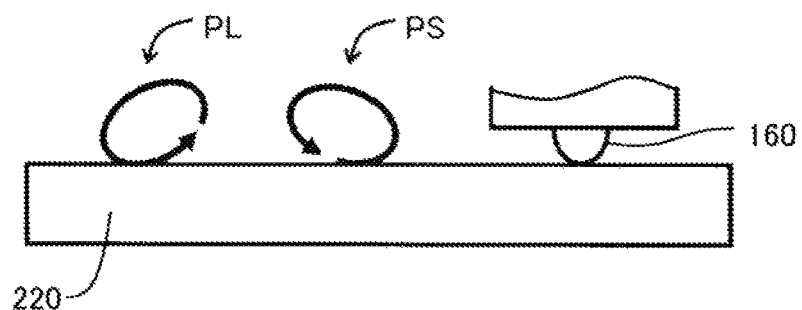
FIG. 5 is an explanatory view illustrating the movement of an extrusion driving mode and a tension driving mode of a contact.

FIG. 5 is an explanatory view illustrating two driving modes due to a difference in movement of the contact 160. As the driving mode by the contact 160, there are an extrusion driving mode PS (push driving mode) and a tension driving mode PL (pull driving mode). In the extrusion driving mode PS, the driving force along the driving direction is transmitted to the driven member 220 while increasing the force by which the contact 160 pushes the driven member 220. Therefore, in the extrusion driving mode PS, a large driving force can be applied to the driven member 220. Meanwhile, in the tension driving mode PL, the driving force along the driving direction is transmitted to the driven member 220 while reducing the force by which the contact 160 pushes the driven member 220. Therefore, in the tension driving mode PL, it is difficult to apply a large driving force to the driven member 220. Taking the characteristics into consideration, it is preferable to drive the driven member 220 in the extrusion driving mode PS instead of the tension driving mode PL.

Figure 6:
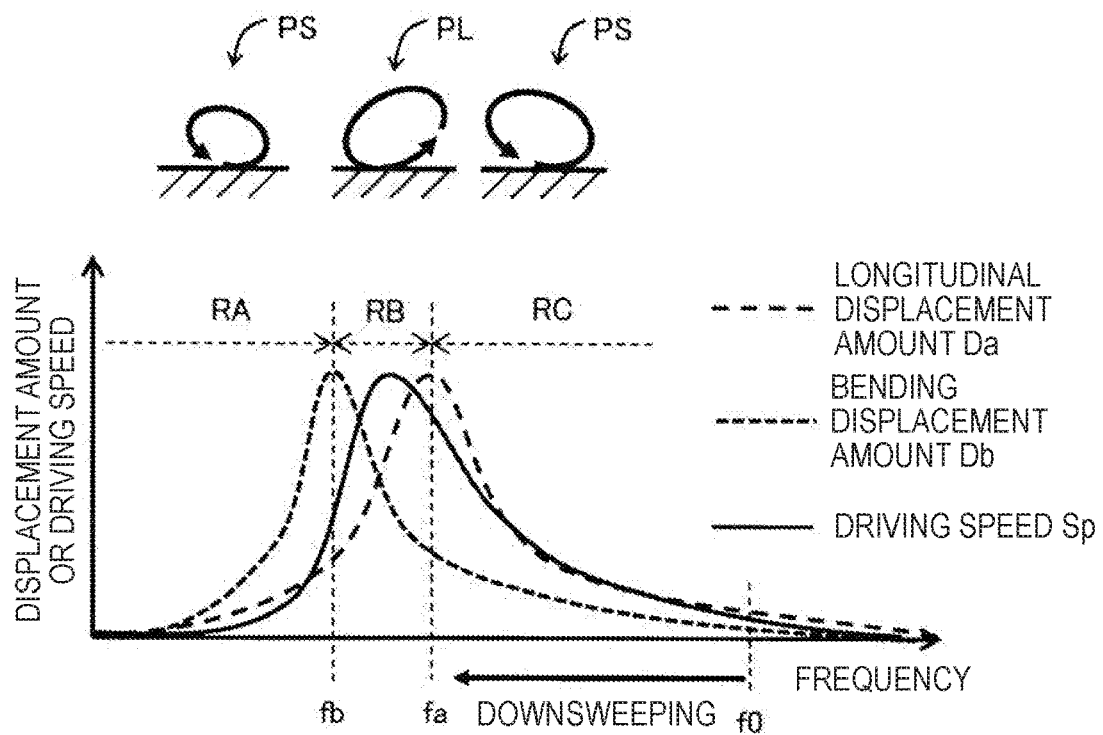
FIG. 6 is a graph illustrating characteristics of a displacement amount and a driving speed in an embodiment.

FIG. 6 is a graph illustrating characteristics of a displacement amount and a driving speed in a first embodiment. The horizontal axis is the frequency of the driving voltages V1 to V3 (FIG. 4). The piezoelectric vibrating body 100 is configured such that a resonance frequency fa of the longitudinal vibration is higher than a resonance frequency fb of the bending vibration. In addition, the resonance frequencies fa and fb can be changed by adjusting the length and the width of the vibrating portion 110 (FIG. 1) of the piezoelectric vibrating body 100. "Length of vibrating portion 110" means a dimension in the longitudinal direction (first direction X) of the vibrating portion 110. "Width of vibrating portion 110" means a dimension in the lateral direction (third direction Z) of the vibrating portion 110. For example, when a ratio between the length and the width of the vibrating portion 110 is set to approximately 7:2, the resonance frequency fa of the longitudinal vibration and the resonance frequency fb of the bending vibration can be a substantially equivalent value. When the width of the vibrating portion 110 is set to be shorter than this, the resonance frequency fa of the longitudinal vibration can be higher than the resonance frequency fb of the bending vibration.

In FIG. 6, a graph of the frequency dependence characteristics of a longitudinal displacement amount Da, a bending displacement amount db, and a driving speed Sp is illustrated. The longitudinal displacement amount Da means a displacement amount of the contact 160 along the first direction X in the longitudinal vibration. The bending displacement amount db means a displacement amount of the contact 160 in the third direction Z in bending vibration. The driving speed Sp means a speed at which the driven member 220 is driven. The longitudinal displacement amount Da is the maximum at the resonance frequency fa of the longitudinal vibration. The bending displacement amount db is the maximum at the resonance frequency fb of the bending vibration. The driving speed Sp becomes the maximum at a position between the two resonance frequencies fa and fb.

The entire region of the frequency of the driving voltage can be divided into a frequency region RA in which the frequency resonance is equal to or lower than the resonance frequency fb of the bending vibration, a frequency region RB in which the frequency resonance ranges between the two resonance frequencies fa and fb, and a frequency region RC in which the resonance frequency is equal to or higher than the resonance frequency fa of the longitudinal vibration. In the frequency region RA, the driven member 220 can be driven in the extrusion driving mode PS, but the driving speed Sp is substantially low. In the frequency region RB, although the driving speed Sp is the highest, the driving characteristics become peaky (steep mountain-like characteristics), and excellent control is difficult. In the frequency region RC, the driving speed Sp is relatively high, and there is an advantage that the change is gentle and control is easy.

The driving voltage generation portion 310 of the driving circuit 300 drives the piezoelectric elements 147A to 147E of the piezoelectric vibrating body 100 in the frequency region RC of FIG. 6. In other words, the driving voltage generation portion 310 generates a voltage having the driving frequency equal to or higher than the resonance frequency fa of the longitudinal vibration, as the driving voltages V1 to V3 (FIG. 4) of the piezoelectric elements 147A to 147E. In this manner, it is possible to drive the driven member 220 by stably generating a large torque.

In addition, the driving frequency appropriate for driving the piezoelectric element changes depending on the situation, such as an aspect of the driven member 220 or environmental temperature. In order to generate a high driving force in the piezoelectric driving device 400, it is desirable to perform driving control so as to follow the driving frequency appropriate for the situations. Therefore, it is preferable to set the driving frequency to an appropriate frequency while sweeping down the driving frequency from a frequency higher than the resonance frequency fa of the longitudinal vibration in the frequency region RC in which the resonance frequency is equal to or greater than the resonance frequency fa of the longitudinal vibration. In this manner, it is possible to appropriately set an appropriate driving frequency that corresponds to various situations. In the example of FIG. 6, when driving of the piezoelectric elements 147A to 147E is started, firstly, the driving frequency is set to a predetermined frequency f0, and after this, the driving frequency is gradually lowered to set the resonance frequency to be equal to or greater than the resonance frequency fa of the longitudinal vibration and to the frequency close to the resonance frequency fa of the longitudinal vibration. In this manner, since it is possible to gradually increase the driving speed Sp while always driving the driven member 220 in the extrusion driving mode PS, it is possible to adjust to the preferable driving speed Sp while stably generating large torque.

Figure 7:
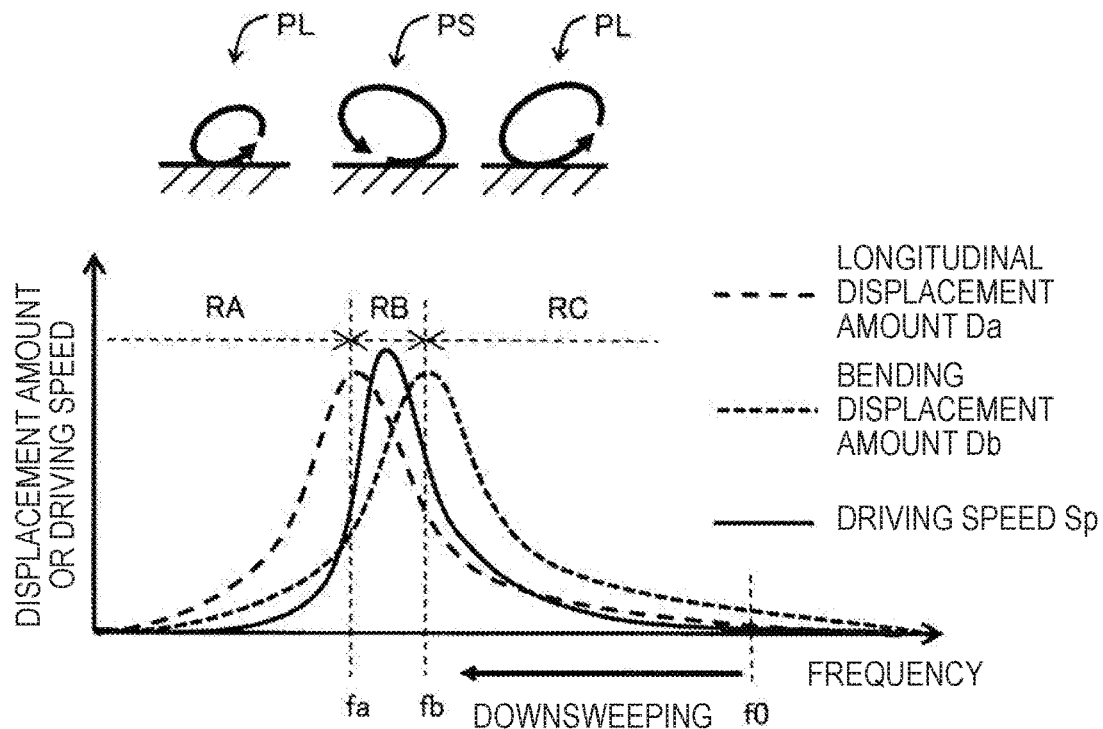
FIG. 7 is a graph illustrating characteristics of a displacement amount and a driving speed in a comparative example.

FIG. 7 is a graph illustrating characteristics of the displacement amount and the driving speed in the comparative example. In the comparative example, the point of the resonance frequency fb of the bending vibration is higher than the resonance frequency fa of the longitudinal vibration is different from the first embodiment illustrated in FIG. 6. In a case where the piezoelectric element is driven in the frequency region RC in which the resonance frequency is higher than the resonance frequency fb of the bending vibration, it is difficult for the contact 160 to operate in the tension driving mode PL and to output a large torque. Meanwhile, in a case where the piezoelectric element is driven in the frequency region RB in which the resonance frequency ranges between the resonance frequency fa of the longitudinal vibration and the resonance frequency fb of the bending vibration, the contact 160 operates in the extrusion driving mode PS, but regarding the frequency that can realize the extrusion driving mode PS, only in the frequency region RB in which the resonance frequency ranges between the two resonance frequencies fa and fb. Therefore, in a case where the two resonance frequencies fa and fb are close to each other, the range of the driving frequency appropriate is extremely narrow. Therefore, the driving characteristics of the piezoelectric driving device become extremely peaky (steep mountain-like characteristics), and there is a problem that excellent control is difficult.

Meanwhile, according to the characteristics of the first embodiment illustrated in FIG. 6, since the resonance frequency fa of the longitudinal vibration is higher than the resonance frequency fb of the bending vibration, by driving the piezoelectric element in the frequency region RC in which the resonance frequency is equal to or greater than the resonance frequency fa of the longitudinal vibration, it is possible to drive the driven member 220 with a stable large driving force.

In addition, it is preferable that the value of the preferable driving frequency is determined in accordance with the vibration detection signal Sv (FIG. 1) supplied from the pickup electrode 180 to the driving circuit 300. For example, the frequencies of the driving voltages V1 to V3 can be adjusted such that the phase difference between the driving voltage V1 (or V2) supplied to the piezoelectric element and the vibration detection signal Sv detected by the pickup electrode 180 becomes a predetermined preferable value. Otherwise, the frequencies of the driving voltages V1 to V3 may be adjusted such that the amplitude of the vibration detection signal Sv becomes sufficiently large.

In the first embodiment, as described in FIG. 2 in advance, since the pickup electrode 180 is disposed at the position on the center axis CX of the piezoelectric vibrating body 100 which extends along the first direction X, there is an advantage that the longitudinal vibration of the piezoelectric vibrating body 100 is easily detected. Furthermore, when arranging the pickup electrodes 180 at any position of the nodes n1, n2, and n3 of the bending vibration, it is possible to reduce the influence of the bending vibration, and thus, the longitudinal vibration of the piezoelectric vibrating body 100 can be more easily detected. As a result, it is possible to easily set the frequency of the driving voltage to an appropriate value.

As described above, in the piezoelectric driving device 400 of the first embodiment, the piezoelectric vibrating body 100 is configured such that the resonance frequency fa of the longitudinal vibration is higher than the resonance frequency fb of the bending vibration, and the driving circuit 300 generates a driving voltage having a driving frequency equal to or higher than the resonance frequency fa of the longitudinal vibration and supplies the driving voltage to the piezoelectric element. Therefore, it is possible to drive the driven member 220 by stably generating a large torque by the piezoelectric driving device 400.

Other Embodiments

Figure 8:
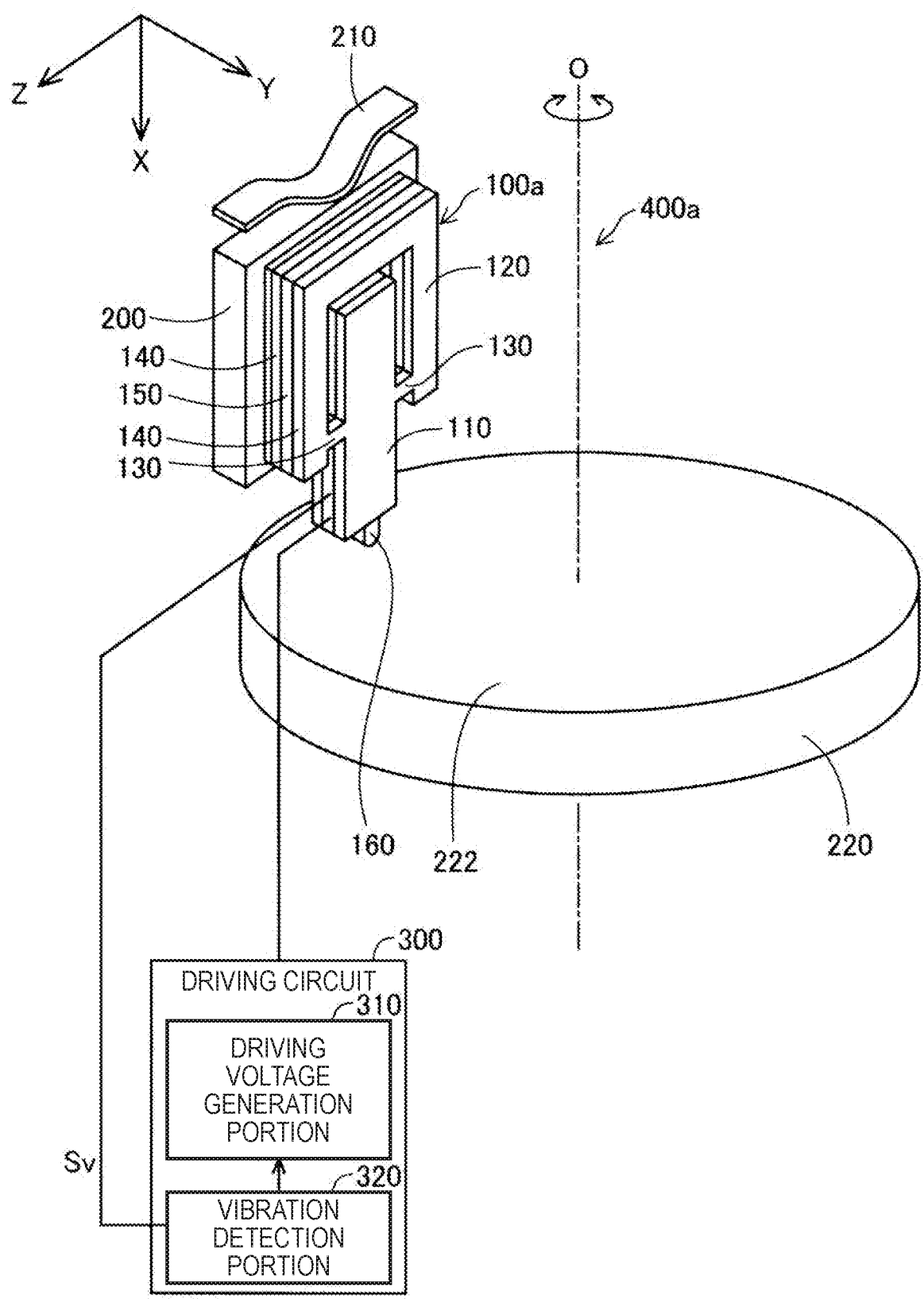
FIG. 8 is a perspective view illustrating a driving mechanism provided with a piezoelectric driving device according to a second embodiment.

FIG. 8 is a perspective view illustrating a driving mechanism provided with a piezoelectric driving device 400a according to a second embodiment. The piezoelectric driving device 400a is different from the first embodiment in that a second piezoelectric vibration module 150 is disposed between the plurality of piezoelectric vibration modules 140, and other configurations are the same as those of the first embodiment. In other words, in the above-described FIG. 1, the three piezoelectric vibration modules 140 are laminated in the second direction Y, but in the second embodiment illustrated in FIG. 8, between the two first piezoelectric vibration modules 140, the second piezoelectric vibration module 150 having a structure different from that of the piezoelectric vibration module 140 is disposed.

Figure 9:
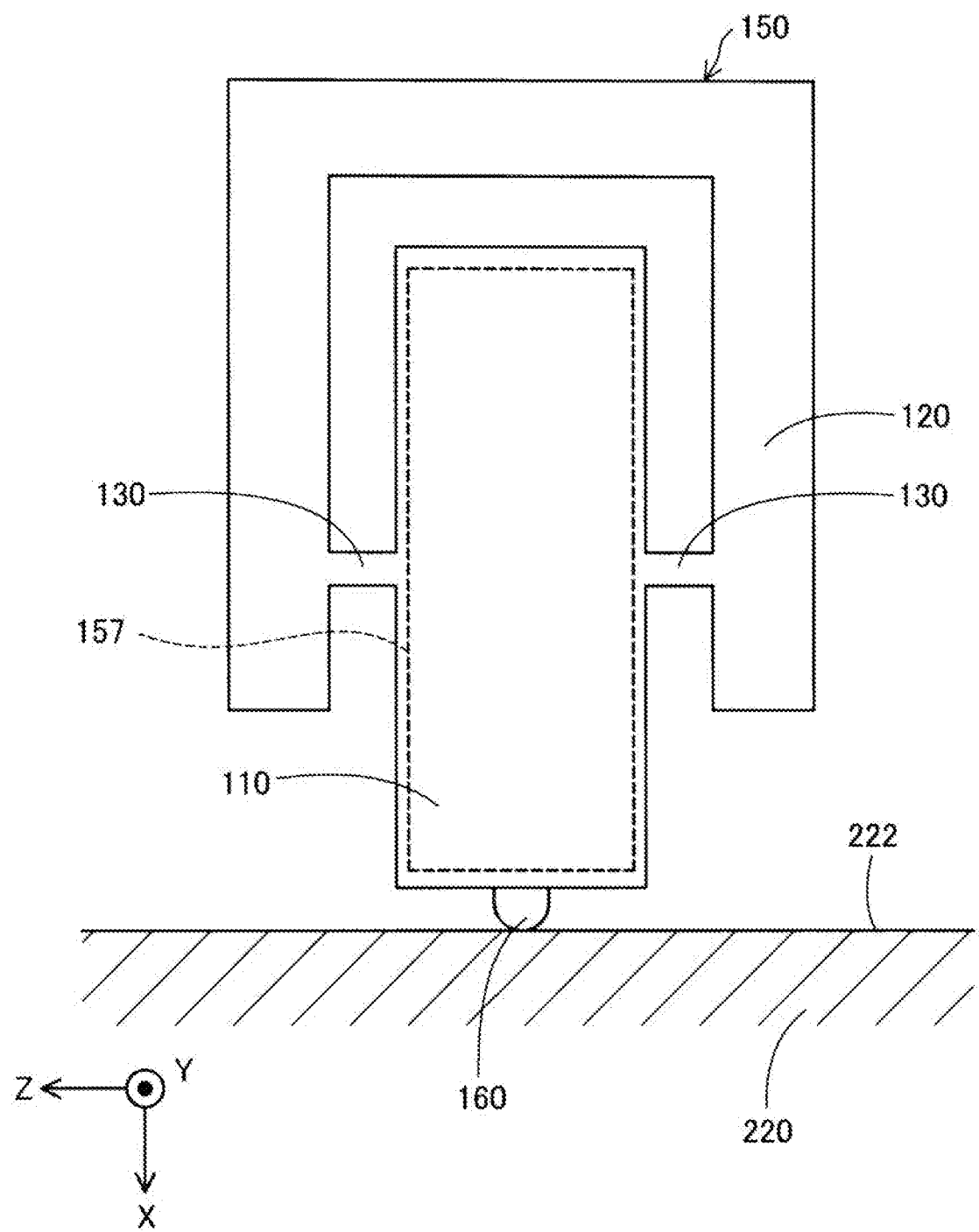
FIG. 9 is a plan view of a second piezoelectric vibration module of the second embodiment.

FIG. 9 is a plan view of the second piezoelectric vibration module 150 of the second embodiment. The second piezoelectric vibration module 150 has one piezoelectric element 157 disposed so as to widen over substantially the entire region of the vibrating portion 110 thereof. Similar to the piezoelectric element 147C (FIG. 2) disposed at the center of the first piezoelectric vibration module 140, the piezoelectric element 157 generates the longitudinal vibration and corresponds to "second piezoelectric element". Therefore, the same driving voltage as the driving voltage V2 (FIG. 4) supplied to the piezoelectric element 147C may be supplied to the piezoelectric element 157. In addition, in the second embodiment, since the second piezoelectric vibration module 150 generates longitudinal vibration, the piezoelectric element 147C of the first piezoelectric vibration module 140 (FIG. 2) may be omitted. The piezoelectric driving device 400a of the second embodiment also has substantially the same effect as that of the piezoelectric driving device 400 of the first embodiment.

Figure 10:
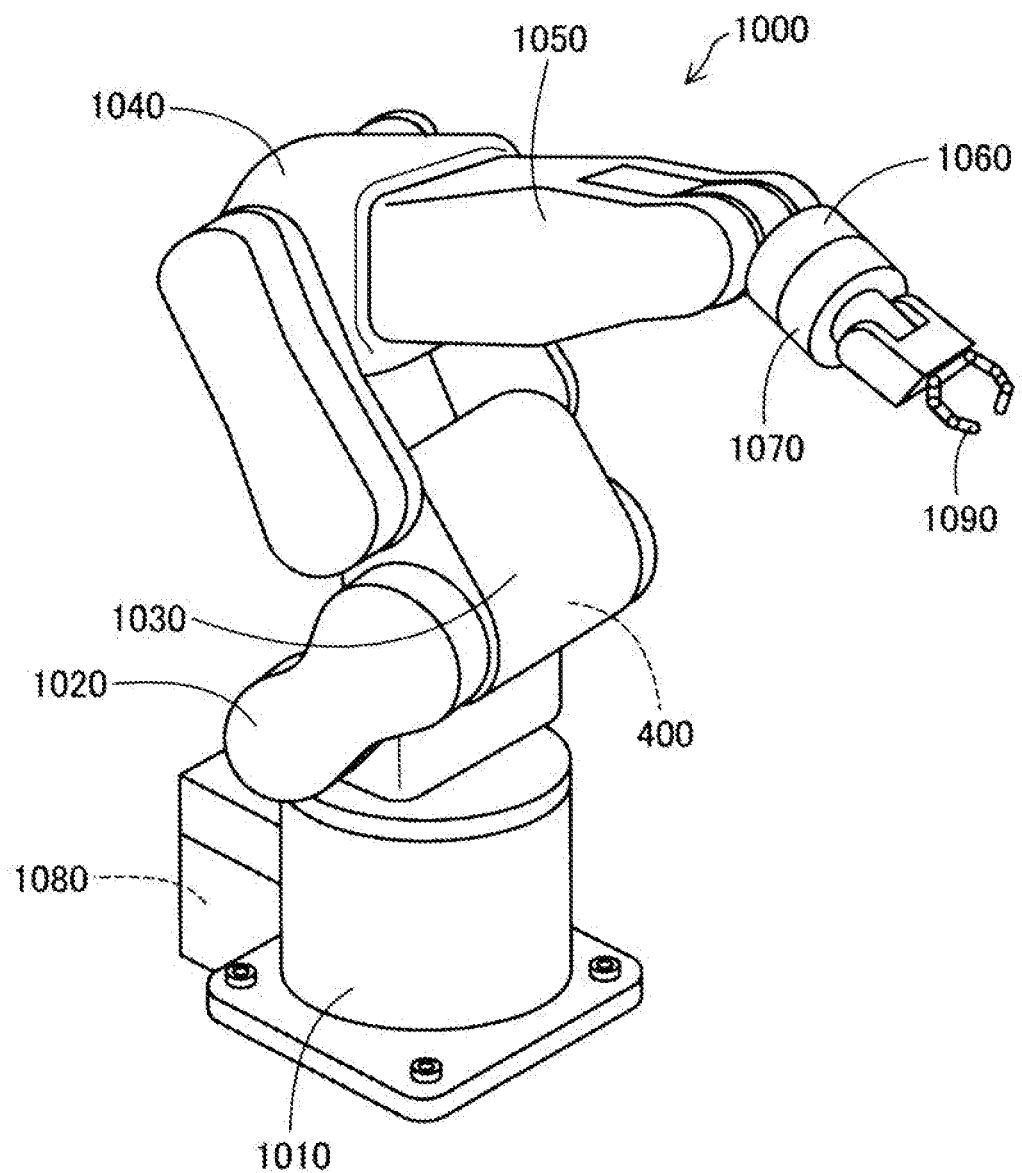
FIG. 10 is a perspective view illustrating a robot according to another embodiment.

FIG. 10 is a perspective view illustrating a robot according to another embodiment. A robot 1000 is a six-axis robot, and includes a base 1010 fixed to a floor or a ceiling, arms 1020, 1030, 1040, 1050, 1060, and 1070 which are rotatably linked to the base 1010, and a robot control portion 1080 for controlling the driving of the arms 1020, 1030, 1040, 1050, 1060, and 1070. In addition, a hand connecting portion is provided in the arm 1070, and an end effector 1090 that corresponds to work to be performed by the robot 1000 is attached in the hand connecting portion. In addition, the piezoelectric driving device 400 is mounted on all or a part of each joint portion, and each of the arms 1020, 1030, 1040, 1050, 1060, and 1070 rotates by the driving of the piezoelectric driving device 400. In addition, the driving of each of the piezoelectric driving devices 400 is controlled by the robot control portion 1080. Further, the piezoelectric driving device 400 may be mounted on the end effector 1090 and used to drive the end effector 1090. Since the robot 1000 is provided with the piezoelectric driving device 400, it is possible to achieve the effect of the above-described piezoelectric driving device 400.

Figure 11:
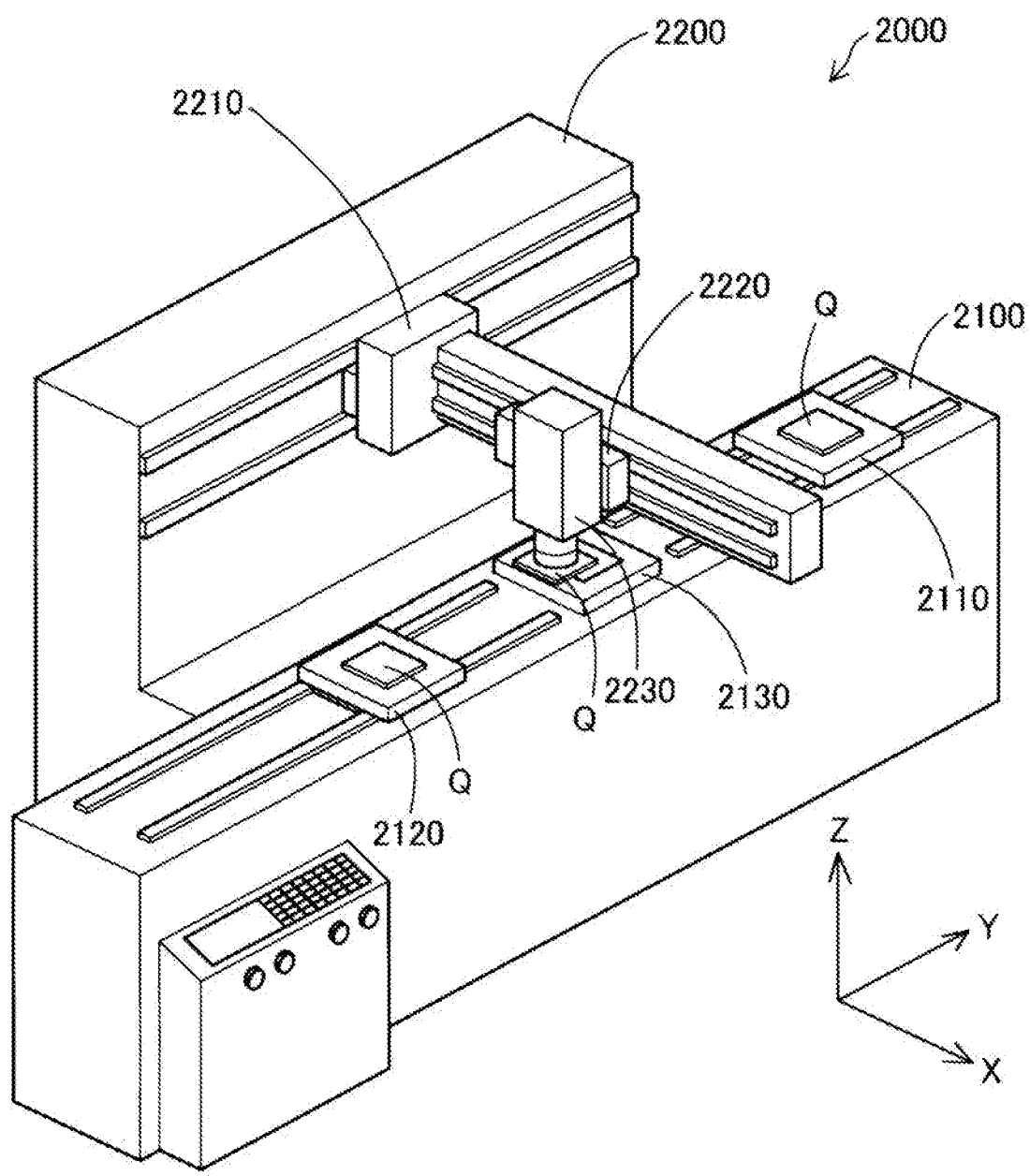
FIG. 11 is a perspective view illustrating an electronic component transport apparatus according to still another embodiment.
Figure 12:
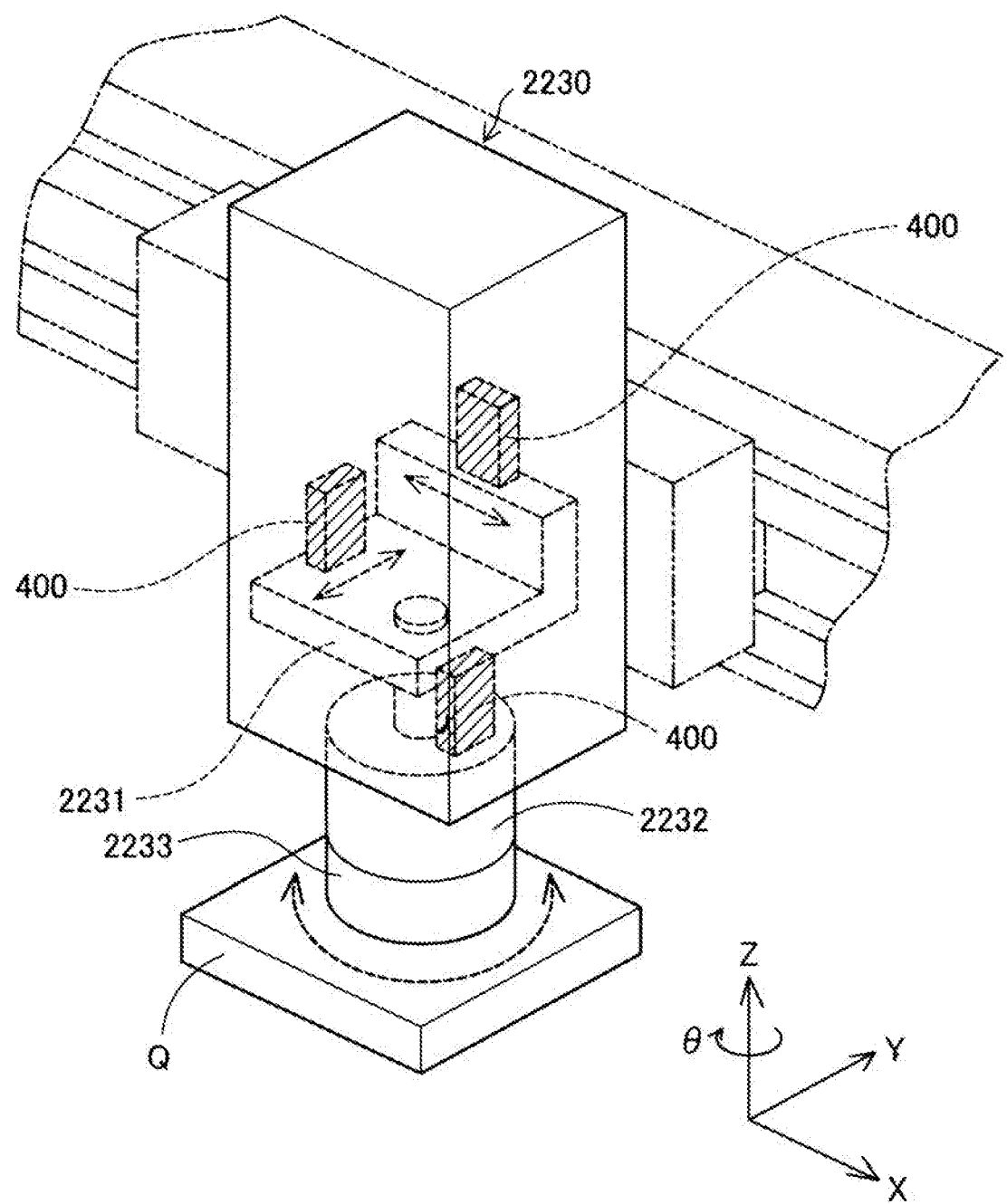
FIG. 12 is a perspective view illustrating an electronic component holding portion of the electronic component transport apparatus.

FIG. 11 is a perspective view illustrating an electronic component transport apparatus according to still another embodiment. FIG. 12 is a perspective view illustrating an electronic component holding portion of the electronic component transport apparatus illustrated in FIG. 11. In addition, in the following description, for convenience of description, three axes orthogonal to each other are referred to as an X-axis, a Y-axis, and a Z-axis. The directions X, Y, and Z of the three axes are irrelevant to the three directions X, Y, and Z described in FIG. 1 and the like.

An electronic component transport apparatus 2000 illustrated in FIG. 11 is applied to an electronic component inspection apparatus, and includes a base 2100 and a support base 2200 disposed on a side of the base 2100. Further, on the base 2100, an upstream stage 2110 on which an electronic component Q which is an inspection target is placed and transported in the Y-axis direction, a downstream stage 2120 on which the inspected electronic component Q is placed and transported in the Y-axis direction, and an inspection table 2130 which is positioned between the upstream stage 2110 and the downstream stage 2120 and inspects the electrical characteristics of the electronic component Q, are provided. In addition, examples of the electronic component Q include a semiconductor, a semiconductor wafer, a display device, such as a CLD and an OLED, a quartz crystal device, various sensors, an ink jet head, various MEMS devices, and the like. A Y stage 2210 which is movable in the Y-axis direction with respect to the support base 2200 is provided on the support base 2200, an X stage 2220 which is movable in the X-axis direction with respect to the Y stage 2210 is provided on the Y stage 2210, and an electronic component holding portion 2230 which is movable in the Z-axis direction with respect to the X stage 2220 is provided on the X stage 2220.

As illustrated in FIG. 12, the electronic component holding portion 2230 includes a fine adjustment plate 2231 which is movable in the X-axis direction and in the Y-axis direction, a rotating portion 2232 which is rotatable around the Z-axis with respect to the fine adjustment plate 2231, and a holding portion 2233 which is provided in the rotating portion 2232 and holds the electronic component Q. In addition, the electronic component holding portion 2230 is internally provided with the piezoelectric driving device 400 for moving the fine adjustment plate 2231 in the X-axis direction, the piezoelectric driving device 400 for moving the fine adjustment plate 2231 in the Y-axis direction, and the piezoelectric driving device 400 for rotating the rotating portion 2232 around the Z-axis. Since the electronic component transport apparatus 2000 is provided with the piezoelectric driving device 400, it is possible to achieve the effect of the above-described piezoelectric driving device 400.

Figure 13:
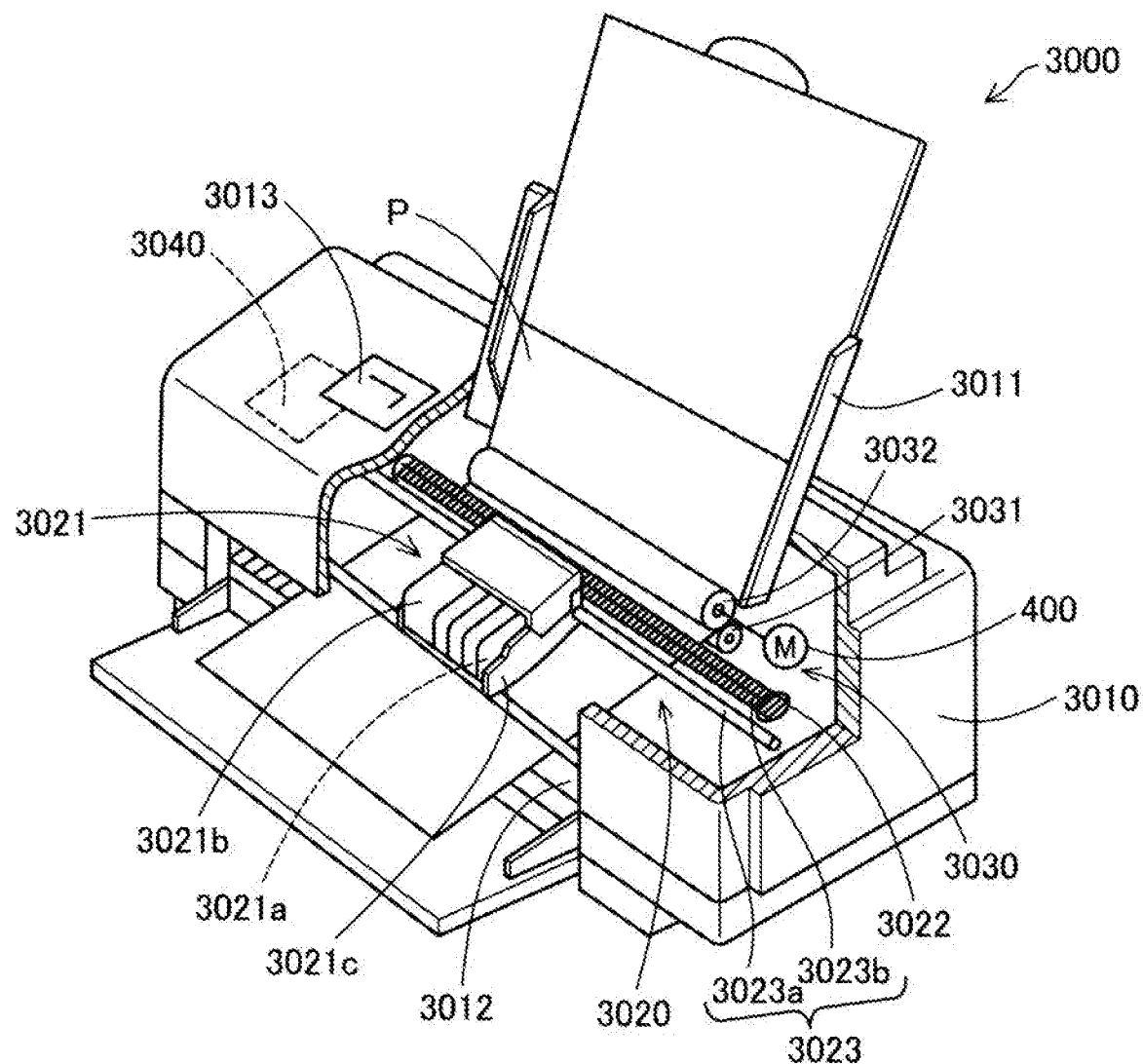
FIG. 13 is a schematic view illustrating a printer according to still another embodiment.

FIG. 13 is a schematic view illustrating the entire configuration of a printer according to still another embodiment. A printer 3000 includes an apparatus main body 3010, a printing mechanism 3020 provided on the inside of the apparatus main body 3010, a paper feeding mechanism 3030, and a control portion 3040. In addition, the apparatus main body 3010 is provided with a tray 3011 for installing a recording paper sheet P, a paper discharge port 3012 for discharging the recording paper sheet P, and an operation panel 3013, such as a liquid crystal display.

The printing mechanism 3020 includes a head unit 3021, a carriage motor 3022, and a reciprocating mechanism 3023 for reciprocating the head unit 3021 by the driving force of the carriage motor 3022. Further, the head unit 3021 includes a head 3021a which is an ink jet type recording head, an ink cartridge 3021b which supplies the ink to the head 3021a, and a carriage 3021c which mounts the head 3021a and the ink cartridge 3021b thereon.

The reciprocating mechanism 3023 includes a carriage guide shaft 3023a which supports the carriage 3021c so as to be capable of reciprocating, and a timing belt 3023b which moves the carriage 3021c on the carriage guide shaft 3023a by the driving force of the carriage motor 3022.

The paper feeding mechanism 3030 includes a driven roller 3031 and a driving roller 3032 which are in pressure contact with each other, and the piezoelectric driving device 400 which is a paper feeding motor that drives the driving roller 3032.

The control portion 3040 controls the printing mechanism 3020 or the paper feeding mechanism 3030 or the like based on printing data input from a host computer, such as a personal computer.

In the printer 3000, the paper feeding mechanism 3030 intermittently feeds the recording paper sheet P one by one to the vicinity of the lower portion of the head unit 3021. At this time, the head unit 3021 reciprocates in a direction substantially orthogonal to the feeding direction of the recording paper sheet P, and printing on the recording paper sheet P is performed.

Since the printer 3000 is provided with the piezoelectric driving device 400, it is possible to achieve the effect of the above-described piezoelectric driving device 400. In addition, in the embodiment, the piezoelectric driving device 400 drives the driving roller 3032 for feeding, but in addition to this, for example, the carriage 3021c may be driven.

Figure 14:
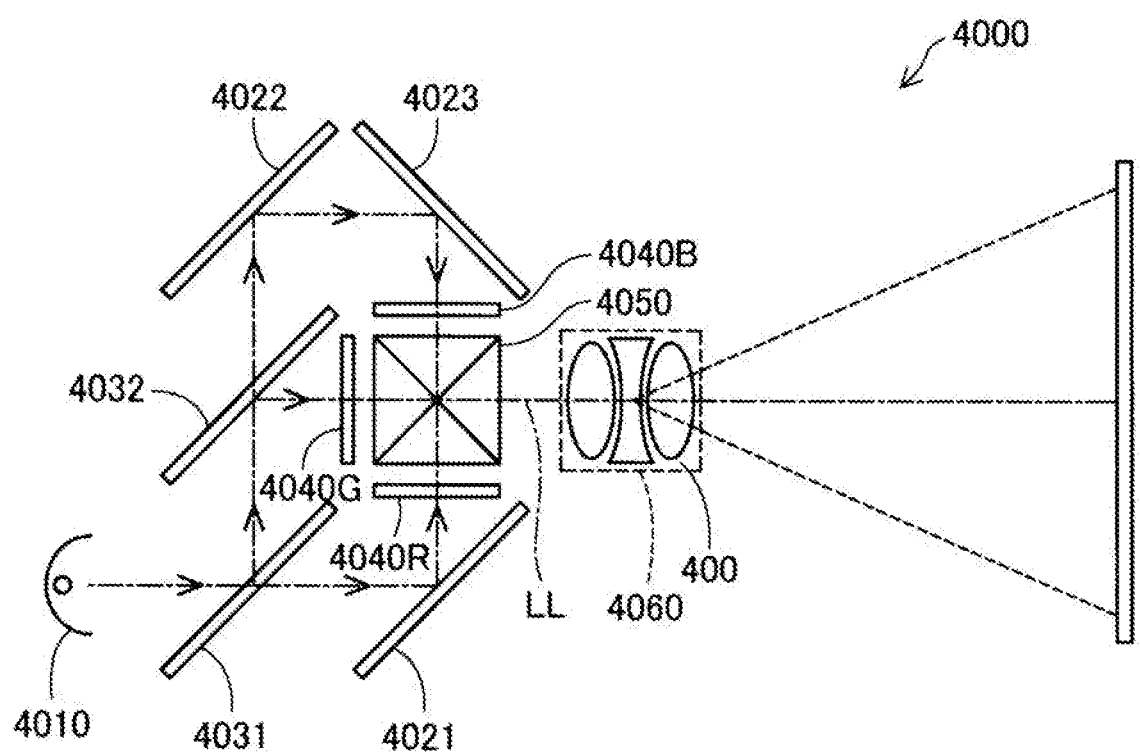
FIG. 14 is a schematic view illustrating a projector according to still another embodiment.

FIG. 14 is a schematic view illustrating the entire configuration of a projector according to still another embodiment. A projector 4000 is an LCD type projector and includes a light source 4010, mirrors 4021, 4022, and 4023, dichroic mirrors 4031 and 4032, liquid crystal display elements 4040R, 4040G, and 4040B, a dichroic prism 4050, a projection lens system 4060, and the piezoelectric driving device 400.

Examples of the light source 4010 include a halogen lamp, a mercury lamp, a light emitting diode (LED), and the like. In addition, as the light source 4010, one that emits white light is used. Further, the light emitted from the light source 4010 is first separated into red light (R) and other light beams by the dichroic mirror 4031. After being reflected by the mirror 4021, the red light is incident on the liquid crystal display element 4040R, and the other light beams are further separated into green light (G) and blue light (B) by the dichroic mirror 4032. In addition, the green light is incident on the liquid crystal display element 4040G, the blue light is reflected by the mirrors 4022 and 4023, and then is incident on the liquid crystal display element 4040B.

Each of the liquid crystal display elements 4040R, 4040G, and 4040B is used as a spatial light modulator. The liquid crystal display elements 4040R, 4040G, and 4040B are transmissive spatial light modulators that correspond to the original colors of R, G, and B, respectively, and have pixels arranged in a matrix of, for example, 1080 rows in the vertical direction and 1920 columns in the horizontal direction. In each pixel, the amount of transmitted light with respect to the incident light is adjusted, and the light amount distribution of all of the pixels is modulated and controlled in each of the liquid crystal display elements 4040R, 4040G, and 4040B. The light spatially modulated by the liquid crystal display elements 4040R, 4040G, and 4040B is combined by the dichroic prism 4050, and full color image light LL is emitted from the dichroic prism 4050. In addition, the emitted image light LL is enlarged by the projection lens system 4060 and projected onto, for example, a screen or the like. The piezoelectric driving device 400 can change the focal length by moving at least one lens included in the projection lens system 4060 in the optical axis direction. Since the projector 4000 is provided with the piezoelectric driving device 400, it is possible to achieve the effect of the above-described piezoelectric driving device 400.

In the above-described various embodiments, the configuration in which the piezoelectric driving device is applied to a robot, an electronic component transport apparatus, a printer, and a projector has been described, but a piezoelectric driving device can be applied to various other apparatuses.

The entire disclosure of Japanese Patent Application No. 2017-146028, filed Jul. 28, 2017 is expressly incorporated by reference herein.

What is claimed is:

1. A piezoelectric driving device for driving a driven member, comprising:
    a piezoelectric vibrating body; and
    a driving circuit configured to generate a first driving voltage having a first signal phase and a second driving voltage having a second signal phase for electrically driving the piezoelectric vibrating body,
    wherein the piezoelectric vibrating body includes:
        a contact which extends in a first direction with respect to the driven member and comes into contact with the driven member;
        a first piezoelectric element which generates bending vibration in a direction intersecting with the first direction in accordance with the first driving voltage supplied from the driving circuit;
a first electrode to which the first driving voltage is applied;
a second piezoelectric element which generates longitudinal vibration in the first direction in accordance with the second driving voltage supplied from the driving circuit; and
a second electrode to which the second driving voltage is applied,
wherein the driving circuit supplies the first driving voltage and the second driving voltage to the first piezoelectric element and the second piezoelectric elements via the first electrode and the second electrode, respectively, at the same time,
a resonance frequency of the longitudinal vibration is higher than a resonance frequency of the bending vibration,
the driving circuit sets first and second driving frequencies of the first driving voltage and the second driving voltage, respectively, to be equal to or higher than the resonance frequency of the longitudinal vibration, and the first and second frequencies are the same, and
the first signal phase of the first driving voltage is different from the second signal phase of the second driving voltage.

2. The piezoelectric driving device according to claim 1, wherein the driving circuit sets each of the first and second driving frequencies to be equal to or higher than the resonance frequency of the longitudinal vibration by sweeping down each of the first and second driving frequencies from a frequency higher than the resonance frequency of the longitudinal vibration.

3. The piezoelectric driving device according to claim 1, wherein the piezoelectric vibrating body further includes a pickup electrode for detecting vibration of the piezoelectric vibrating body and supplying a vibration detection signal to the driving circuit,
wherein the driving circuit determines each of the first and second driving frequencies in accordance with the vibration detection signal, and
wherein the pickup electrode is disposed at a position on a center axis of the piezoelectric vibrating body that extends along the first direction.

4. The piezoelectric driving device according to claim 3, wherein the pickup electrode is disposed at a position that becomes a node of the bending vibration.

5. A robot comprising:
the piezoelectric driving device according to claim 1.
6. A robot comprising:
the piezoelectric driving device according to claim 2.
7. A robot comprising:
the piezoelectric driving device according to claim 3.
8. A robot comprising:
the piezoelectric driving device according to claim 4.

9. An electronic component transport apparatus comprising:
the piezoelectric driving device according to claim 1.
10. An electronic component transport apparatus comprising:
the piezoelectric driving device according to claim 2.
11. An electronic component transport apparatus comprising:
the piezoelectric driving device according to claim 3.
12. An electronic component transport apparatus comprising:
the piezoelectric driving device according to claim 4.
13. A printer comprising:
the piezoelectric driving device according to claim 1.
14. A printer comprising:
the piezoelectric driving device according to claim 2.
15. A printer comprising:
the piezoelectric driving device according to claim 3.
16. A printer comprising:
the piezoelectric driving device according to claim 4.
17. A projector comprising:
the piezoelectric driving device according to claim 1.
18. A projector comprising:
the piezoelectric driving device according to claim 2.
19. A projector comprising:
the piezoelectric driving device according to claim 3.

20. A driving method of a piezoelectric driving device including a piezoelectric vibrating body which includes a contact which extends in a first direction with respect to a driven member and comes into contact with the driven member, a first piezoelectric element which generates bending vibration in a direction intersecting with the first direction in accordance with a first driving voltage, and a second piezoelectric element which generates longitudinal vibration in the first direction in accordance with a second driving voltage, the driving method comprising:
supplying the first driving voltage having a first signal phase and the second driving voltage having a second signal phase to the first piezoelectric element and the second piezoelectric elements via a first electrode and a second electrode, respectively, at the same time;
setting a resonance frequency of the longitudinal vibration to be higher than a resonance frequency of the bending vibration; and
setting the first driving voltage and the second driving voltage to have a first driving frequency and a second driving frequency, respectively, each of the first and second driving frequencies being equal to or higher than the resonance frequency of the longitudinal vibration, the first and second driving frequencies being the same,
wherein the first signal phase of the first driving voltage is different from the second signal phase of the second driving voltage.

* * * * *